(12) United States Patent
Savarda et al.

(10) Patent No.: US 11,953,529 B2
(45) Date of Patent: Apr. 9, 2024

(54) POSITION SENSING MODULES AND RELATED DEVICES AND METHODS

(71) Applicant: Sensus Spectrum, LLC, Morrisville, NC (US)

(72) Inventors: Matthew James Savarda, Wake Forest, NC (US); Michael Ray Brown, Mandeville, LA (US); Andrew James Bryce Dudding, Cary, NC (US)

(73) Assignee: Sensus Spectrum, LLC, Morrisville, NC (US)

( * ) Notice: Subject to any disclaimer, the term of this patent is extended or adjusted under 35 U.S.C. 154(b) by 132 days.

(21) Appl. No.: 16/809,827

(22) Filed: Mar. 5, 2020

(65) Prior Publication Data
US 2020/0284826 A1    Sep. 10, 2020

Related U.S. Application Data

(60) Provisional application No. 62/813,884, filed on Mar. 5, 2019.

(51) Int. Cl.
*G01R 21/133* (2006.01)
*G01D 3/08* (2006.01)
(Continued)

(52) U.S. Cl.
CPC ............ *G01R 21/133* (2013.01); *G01R 11/24* (2013.01); *G01R 11/25* (2013.01); *G01R 22/066* (2013.01);
(Continued)

(58) Field of Classification Search
CPC .. G01R 21/133; G01R 31/3278; G01R 11/24; G01R 11/25; G01R 22/066;
(Continued)

(56) References Cited

U.S. PATENT DOCUMENTS

| 8,134,820 B1 * | 3/2012 | Riccio | H02H 3/247 361/4 |
| 2008/0100146 A1 * | 5/2008 | Washington | H01H 1/0015 307/130 |

(Continued)

FOREIGN PATENT DOCUMENTS

| EP | 2503343 A1 * | 9/2012 | G01R 11/24 |
| EP | 2940484 A1 * | 11/2015 | G01R 11/25 |

(Continued)

OTHER PUBLICATIONS

International Search Report and Written Opinion, PCT/US2020/021102, dated Jun. 8, 2020.

(Continued)

*Primary Examiner* — Farhana A Hoque
*Assistant Examiner* — Joseph O Nyamogo
(74) *Attorney, Agent, or Firm* — Stanek Lemon Crouse & Meeks, PA

(57) ABSTRACT

Position sensing modules associated with a device are provided. The position sensing modules are configured to receive electrical characteristics associated with one or more switches of a device over a predetermined period of time, the one or more switches being configured to connect service to or disconnect service from a customer; calculate a match indicator for each phase of the device including the one or more switches, the match indicator indicating whether an electrical characteristic on a load-side of the device matches a same electrical characteristic on a line-side of the device for each phase of the device; and determine a position of the one or more switches based on the received electrical characteristics and the calculated match indicator for each phase of the device.

3 Claims, 8 Drawing Sheets

(51) Int. Cl.
| | |
|---|---|
| *G01D 4/00* | (2006.01) |
| *G01R 11/24* | (2006.01) |
| *G01R 11/25* | (2006.01) |
| *G01R 22/06* | (2006.01) |
| *G01R 31/327* | (2006.01) |
| *H01H 9/00* | (2006.01) |
| *H01H 9/16* | (2006.01) |
| *H02J 13/00* | (2006.01) |

(52) U.S. Cl.
CPC ....... *G01R 22/068* (2013.01); *G01R 31/3277* (2013.01); *G01R 31/3278* (2013.01); *H02J 13/00002* (2020.01); *H02J 13/00036* (2020.01); *G01D 3/08* (2013.01); *G01D 2204/24* (2021.05); *H01H 9/0066* (2013.01); *H01H 9/167* (2013.01); *H01H 2239/026* (2013.01); *Y02E 60/00* (2013.01)

(58) Field of Classification Search
CPC .............. G01R 22/068; G01R 31/3277; G01D 2204/24; G01D 3/08; G01D 4/004; H01H 9/0066; H01H 9/167; H01H 2239/026; Y02E 60/00; Y04S 10/30; H02J 13/00002; H02J 13/00036
See application file for complete search history.

(56) References Cited

U.S. PATENT DOCUMENTS

| | | | |
|---|---|---|---|
| 2008/0258709 A1* | 10/2008 | Shuey | G01R 19/16547 |
| | | | 324/110 |
| 2013/0293390 A1 | 11/2013 | Le Buhan et al. | |
| 2015/0241488 A1 | 8/2015 | Sonderegger | |
| 2015/0247900 A1* | 9/2015 | Shuey | G01R 22/065 |
| | | | 324/415 |
| 2015/0316932 A1 | 11/2015 | Kim | |
| 2016/0187393 A1 | 6/2016 | Ramirez | |
| 2016/0268079 A1 | 9/2016 | Kim | |
| 2016/0352142 A1 | 12/2016 | Hughes | |
| 2017/0373506 A1 | 12/2017 | Shuey | |

FOREIGN PATENT DOCUMENTS

| | | | |
|---|---|---|---|
| EP | 3 009 851 A1 | 4/2016 | |
| WO | WO 2015/130823 A1 | 9/2015 | |
| WO | WO-2015130823 A1 * | 9/2015 | ............. G06Q 50/06 |

OTHER PUBLICATIONS

International Search Report and Written Opinion, PCT Application No. PCT/US2020/021104; dated Jun. 25, 2020; 10 pages.

* cited by examiner

| POSITION CODE | LOADA_Ref == LINEA_Ref +/- THRESHOLD | LOADC_Ref == LINEC_Ref +/- THRESHOLD | CURRENT FLOWING IN PHASE A | CURRENT FLOWING IN PHASE C | INFERRED SWITCH STATE | FAULT STATE | LSS |
|---|---|---|---|---|---|---|---|
| 0 | FALSE | FALSE | FALSE | FALSE | OPEN | NO FAULT | FALSE |
| 1 | FALSE | FALSE | FALSE | TRUE | CLOSED | POSSIBLE FAULT STATE | FALSE |
| 2 | FALSE | FALSE | TRUE | FALSE | CLOSED | POSSIBLE FAULT STATE | FALSE |
| 3 | FALSE | FALSE | TRUE | TRUE | CLOSED | POSSIBLE FAULT STATE | FALSE |
| 4 | FALSE | TRUE | FALSE | FALSE | CLOSED** | POSSIBLE BYPASS ON C | TRUE |
| 5 | FALSE | TRUE | FALSE | TRUE | HALF OPEN | PHASE A OPEN | TRUE |
| 6 | FALSE | TRUE | TRUE | FALSE | CLOSED | POSSIBLE FAULT STATE | TRUE |
| 7 | FALSE | TRUE | TRUE | TRUE | CLOSED | POSSIBLE FAULT STATE | TRUE |
| 8 | TRUE | FALSE | FALSE | FALSE | CLOSED** | POSSIBLE BYPASS ON A | TRUE |
| 9 | TRUE | FALSE | FALSE | TRUE | CLOSED | POSSIBLE FAULT STATE | TRUE |
| 10 | TRUE | FALSE | TRUE | FALSE | HALF OPEN | PHASE C OPEN | TRUE |
| 11 | TRUE | FALSE | TRUE | TRUE | CLOSED | POSSIBLE FAULT STATE | TRUE |
| 12 | TRUE | TRUE | FALSE | FALSE | CLOSED | NO FAULT* | TRUE |
| 13 | TRUE | TRUE | FALSE | TRUE | CLOSED | NO FAULT | TRUE |
| 14 | TRUE | TRUE | TRUE | FALSE | CLOSED | NO FAULT | TRUE |
| 15 | TRUE | TRUE | TRUE | TRUE | CLOSED | NO FAULT | TRUE |

* SWITCH IS OPEN BUT BYPASSED THE CLOSE THE CONNECTION - THIS WILL TRIGGER AN ERROR

FIG. 2

| POSITION CODE | LOADA_Ref == LINEA_Ref +/- THRESHOLD | LOADC_Ref == LINEC_Ref +/- THRESHOLD | CURRENT FLOWING IN PHASE A | CURRENT FLOWING IN PHASE C | INFERRED STATE | FAULT STATE | LSS |
|---|---|---|---|---|---|---|---|
| 0 | FALSE | FALSE | FALSE | FALSE | OPEN | NO FAULT | FALSE |
| 1 | FALSE | FALSE | FALSE | TRUE | CLOSED | POSSIBLE FAULT STATE | FALSE |
| 2 | FALSE | FALSE | TRUE | FALSE | CLOSED | POSSIBLE FAULT STATE | FALSE |
| 3 | FALSE | FALSE | TRUE | TRUE | CLOSED | POSSIBLE FAULT STATE | FALSE |
| 4 | FALSE | TRUE | FALSE | FALSE | OPEN | NO FAULT | FALSE |
| 5 | FALSE | TRUE | FALSE | TRUE | HALF OPEN | PHASE A OPEN | FALSE |
| 6 | FALSE | TRUE | TRUE | FALSE | CLOSED | POSSIBLE FAULT STATE | FALSE |
| 7 | FALSE | TRUE | TRUE | TRUE | CLOSED | POSSIBLE FAULT STATE | FALSE |
| 8 | TRUE | FALSE | FALSE | FALSE | OPEN | NO FAULT | FALSE |
| 9 | TRUE | FALSE | FALSE | TRUE | CLOSED | POSSIBLE FAULT STATE | FALSE |
| 10 | TRUE | FALSE | TRUE | FALSE | HALF OPEN | PHASE C OPEN | FALSE |
| 11 | TRUE | FALSE | TRUE | TRUE | CLOSED | POSSIBLE FAULT STATE | FALSE |
| 12 | TRUE | TRUE | FALSE | FALSE | CLOSED | NO FAULT* | TRUE |
| 13 | TRUE | TRUE | FALSE | TRUE | CLOSED | NO FAULT | TRUE |
| 14 | TRUE | TRUE | TRUE | FALSE | CLOSED | NO FAULT | TRUE |
| 15 | TRUE | TRUE | TRUE | TRUE | CLOSED | NO FAULT | TRUE |

FIG. 3

| POSITION CODE | LOADA$_{Ref}$ == LINEA$_{Ref}$ +/- THRESHOLD | CURRENT FLOWING IN PHASE A | INFERRED SWITCH STATE | FAULT STATE |
|---|---|---|---|---|
| 0 | FALSE | FALSE | OPEN | NO FAULT |
| 2 | FALSE | TRUE | CLOSED | POSSIBLE FAULT STATE |
| 8 | TRUE | FALSE | CLOSED | IF LAST SWITCH COMMAND WAS "OPEN", THEN POSSIBLE METER BYPASS. ELSE "CLOSED". |
| 10 | TRUE | TRUE | CLOSED | NO FAULT |

FIG. 4

| RELAY IS | LSS-A | LSS-C | CURRENT | EXCEPTIONS | NOTES |
|---|---|---|---|---|---|
| CLOSED | IF VOLTAGE = LINE @ 180 DEG THEN CLOSED | IF VOLTAGE = 0 THEN CLOSED | CURRENT FLOWING | USER RUNS EXTENSION CORD ON BOTH PHASES AND WIRES THEM EXACTLY CORRESPONDING TO LINE SIDE WIRING, A-TO-A, C-TO-C AND CURRENT REALLY IS ZERO | FOR CLOSED TO BE TRUE BOTH LSS-A AND LSS-C MUST AS SHOWN. |
| OPEN | IF ANY GENERATOR, OR NEUTRAL VOLTAGE THEN IS OPEN | IF ANY GENERATOR, OR NEUTRAL VOLTAGE THEN IS OPEN. | CURRENT IS ZERO IN ALL BUS BARS | NONE | FOR OPEN TO BE TRUE BOTH LSS-A AND LSS-C MUST NOT READ AS PER CLOSED STATE, AND CURRENT MUST BE ZERO |
| HALF-OPEN A | IF ANY GENERATOR, OR NEUTRAL VOLTAGE THEN | IF VOLTAGE = 0 THEN CLOSED | CURRENT IN C ONLY | | |
| HALF-OPEN C | IF VOLTAGE = LINE @ 180 DEG THEN CLOSED | IF ANY GENERATOR, OR NEUTRAL VOLTAGE THEN IS OPEN. | CURRENT IN A ONLY | | |

FIG. 6

| COMMAND RELAY ON 2S | VOLTAGE MEASUREMENT | CURRENT | STATE INFERRED | W/ POS. IND. SW.2 |
|---|---|---|---|---|
| | LOADA/LINEC = LINEA/LINEC | A CURRENT <=ABS(LPC) | EITHER A SIDE CLOSED W/ NO LOAD OR A SIDE OPEN AND PLUGGED TO NEIGHBORS HOUSE | CAN'T TELL IT A SIDE WELDED OR NEIGHBOR'S HOUSE |
| | LOADA/LINEC = LINEA/LINEC | A CURRENT >ABS(LPC) | A SIDE CLOSED | CAN'T TELL IT A SIDE WELDED |
| | LOADA/LINEC = LINEA/LINEC | DOESN'T MATTER | RELAY OPEN AND LOAD C ON A SIDE OF NEIGHBORS HOUSE | OPEN |
| | LOADA/LINEC = VAC | A CURRENT <=ABS(LPC) | OPEN W/ LOAD SIDE VOLTAGE | OPEN |
| | LOADC/LINEC = VAC | C CURRENT <=ABS(LPC) | OPEN W/ LOAD SIDE VOLTAGE | OPEN |
| | LOADA/LINEC = VAC | A CURRENT>ABS(LPC) | A SIDE CLOSED W/ HIGH RESISTANCE CONTACT | CAN'T TELL IF A SIDE WELDED OR NEIGHBOR'S HOUSE |
| | LOADC/LINEC = VAC | C CURRENT>ABS(LPC) | C SIDE CLOSED W/ HIGH RESISTANCE CONTACT | CAN'T TELL IF C WELDED OR NEIGHBOR'S HOUSE |
| | LOADA/LINEC = 1/2LINEA/C | A CURRENT <=ABS(LPC) | RELAY OPEN W/ PASSIVE LOAD TO NEUTRAL | OPEN |
| | LOADC/LINEC = 1/2LINEA/C | C CURRENT <=ABS(LPC) | RELAY OPEN W/ PASSIVE LOAD TO NEUTRAL | OPEN |
| | LOADA/LINEC = 0 | DOESN'T MATTER | RELAY OPEN AND LOAD A ON C SIDE OF NEIGHBORS HOUSE | OPEN |
| | LOADC/LINEC = 0 | C CURRENT>ABS(LPC) | C SIDE CLOSED | CAN'T TELL IF C SIDE WELDED OR NEIGHBOR'S HOUSE |
| | LOADC/LINEC = 0 | C CURRENT <=ABS(LPC) | EITHER C SIDE CLOSED OR C PHASE ON NEIGHBOR HOUSE | CAN'T TELL IF C SIDE WELDED OR NEIGHBOR'S HOUSE |

FIG. 6 CONTINUES

POSITION SENSING MODULES AND RELATED DEVICES AND METHODS

CLAIM OF PRIORITY

This application claims priority to U.S. Provisional Application No. 62/813,884, filed Mar. 5, 2020, entitled Position Sensing Methods and Related Devices and Systems, the contents of which are hereby incorporated herein by reference as if set forth in its entirety.

FIELD

The present inventive concept relates generally to meters and, more particularly, to remote sensing of a position of switch in a meter.

BACKGROUND

With the addition of communication circuits in all sorts of devices, for example, gas, electric and water meters, these devices can communicate with remote locations. Thus, maintenance and meter operations that traditionally had to be performed on site, can now largely be performed remotely. For example, conventional meters can include a remote disconnect capability, enabling the operator to activate or deactivate service remotely. In particular, electric meters, residential or commercial, are currently available with an integrated remote disconnect (RD) switch. The industry standard term for RD is "service switch." The RD switch is configured to be opened and/or closed remotely via commands, for example, radio frequency (RF) commands, sent to the meter from a remote location.

An electric meter having an integral RD switch generally needs to know a position of the switch, i.e. open or closed. The meter has a capability of keeping a record of whether the switch is opened or closed. However, if the switch malfunctions and does not open or close as commanded, the operator has no way of knowing as the operator is not on site. This problem may be addressed using a position of another switch in close proximity to the RD switch to imply the position of the integrated RD switch. However, use of a proximity switch in this manner complicates the design electrically and mechanically and may increase the cost of the meter. Improved methods of sensing a position of an RD switch in a meter are desired.

SUMMARY

Some embodiments of the present inventive concept provide position sensing modules associated with a device, the position sensing modules being configured to receive electrical characteristics associated with one or more switches of a device over a predetermined period of time, the one or more switches being configured to connect service to or disconnect service from a customer; calculate a match indicator for each phase of the device including the one or more switches, the match indicator indicating whether an electrical characteristic on a load-side of the device matches a same electrical characteristic on a line-side of the device for each phase of the device; and determine a position of the one or more switches based on the received electrical characteristics and the calculated match indicator for each phase of the device.

In further embodiments, the match indicator may include a true value or a false value for each phase of the device. A true value may indicate that a measured load-side voltage of the device matches a measured line-side voltage of the device for each phase of the device. A false value may indicate that a measured load-side voltage of the device does not match a measure line-side voltage of the device for each phase of the device.

In still further embodiments, the position sensing module may sum a difference between the line-side voltage and the load-side voltage for each phase; provide the true value if the sum is less than a predetermined threshold match value; and provide the false value if the sum exceeds the predetermined threshold match value.

In some embodiments, the position sensing module is configured to receive root mean square (RMS) currents measured over a period of time for each phase of the device. In certain embodiments, the period of time may be about one second.

In further embodiments, the position sensing module may be configured to provide an indication that a relay is closed if it a true value is calculated for all phases of the device.

In still further embodiments, position sensing module may be further configured to determine if the RMS currents measured over the period of time through each phase is less than a predetermined current threshold; and provide an indication that the relay is open if false values are provided for all phases of the device and it is determined that the RMS currents measured are all less than the predetermined current threshold.

In some embodiments, the position sensing module may be, if it determined that the relay is not open or closed, further configured to determine a state of the relay based on further parameters associated with the device.

BRIEF DESCRIPTION OF THE DRAWINGS

FIG. 2 is a table illustrating inferred positions of an RD switch for multi-phase meters having bypass detection enabled.

FIG. 3 is a table illustrating inferred positions of an RD switch for multi-phase meters having bypass detection disabled.

FIG. 4 is a table illustrating inferred positions of an RD switch for single phase meters.

FIG. 6 is a table illustrating position outputs using a position sensing module in accordance with some embodiments of the present inventive concept.

DETAILED DESCRIPTION

Figure 1:
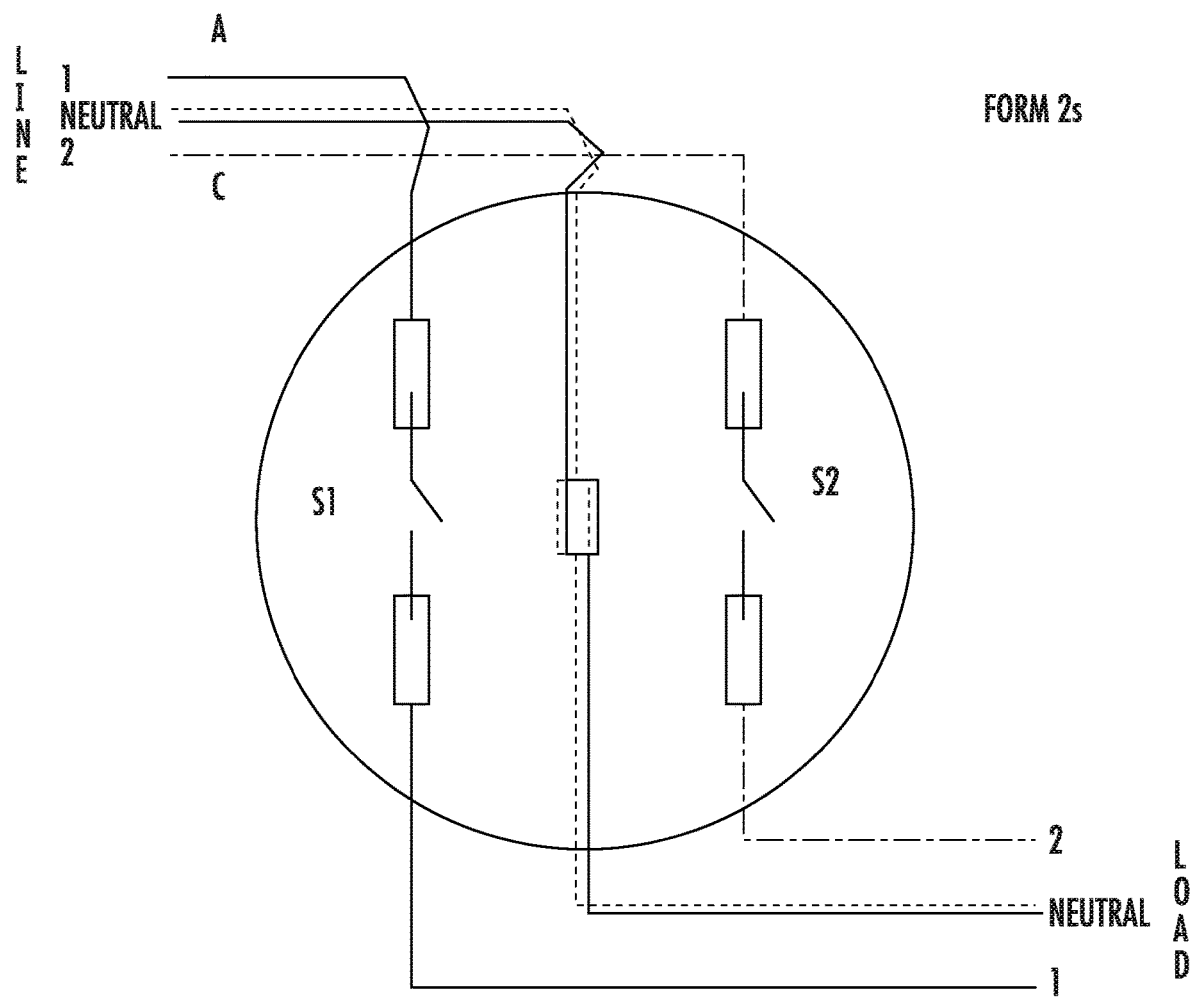
FIG. 1 is a diagram of a meter with a remote disconnect (RD) switch therein.

The present inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

Although embodiments of the present inventive concept are discussed herein with respect to electric meters, specifically residential electric meters, embodiments of the present inventive concept are not limited thereto. For example, embodiments of the present inventive concept can be applied to any type of meter and the meter can be residential or commercial without departing from the scope of the present inventive concept. Furthermore, the meter may be a single phase meter, a two phase meter or more without departing from the scope of the present inventive concept.

As used herein, "Blondel meters" are meters that include N−1 elements for an N wire service. These meters are termed "Blondel compliant." Other meters that don't contain tidy pairings of single potential measuring units with single current measuring units if referred to herein as a "non-Blondel meter."

As used herein, "line side" refers to a side of the device, for example, the meter, where the wires, coming from a power source that deliver the electricity, are connected. In other words, the line side of the device/meter is side where the power comes in from the source. The "load side" refers to the side of the device (meter) that is consuming the power, i.e. the residence, building of the like. An electrical "load" is an electrical component or portion of a circuit that consumes electricity.

As used herein, in some embodiments a "single bypass" generally refers to any condition which causes the voltage, or a portion thereof, of a phase on the line-side of the meter to appear on the corresponding phase of the load side of the meter." Similarly, a "double bypass" refers to a condition that exists when both phases of the meter are bypassed. It will be understood that some meters only have a single active phase and, thus, cannot be double bypassed in a meaningful way. In some embodiments, a bypass may be detected based on the absence of a voltage on a load side of the meter when a switch or relay is open as will be discussed further below. An "unlawful bypass" refers to any configuration of the meter that allows a user to obtain service (water, gas, electric) without usage associated with that service being logged by the meter. Thus, in a physical sense, the meter is physically bypassed to avoid incurring charges associated with the service.

As discussed above, the ability to remotely open and close a switch to provide and discontinue service respectively, makes it difficult to know the position of the switch, i.e. whether the switch is opened or closed. Conventional methods include using a state of a switch in close proximity (proximity switch) to imply the position of the remote disconnect (RD) switch. As used herein, "close proximity" refers to an element being physically near another elements. Such elements are illustrated in FIG. 1. FIG. 1 is a diagram of first and second switches S1 and S2, respectively, positioned in close proximity to one another in a device, for example, a meter. The switches S1 and S2 may be RD switches. As discussed above, systems including RD switches can infer a current position of the RD switch. In particular, when the line side sense (LSS) data is combined with a current of each phase of the meter and the line side voltages of each phase, the RD switch position can be inferred. Current can generally only flow through a phase of the meter when the meter's load side is connected to the line side, i.e. when the switch is closed. In an RD equipped meter, this condition is met when the switch contact is positioned in the "closed" position.

FIG. 1 specifically illustrates a diagram representing a disconnect switch with a contact on each phase of the meter for a 2S meter form. FIG. 1 is provided for example only and it is understood that embodiments of the present inventive concept are not limited to 2S meters and any meter may benefit from embodiments of the present inventive concept. Generally, the switch has two states, open and closed. A 2S meter is connected to a service which has three wires. However, embodiments of the present inventive concept are not limited to three wire meters, embodiments of the present inventive concept may be used on meters having less than or more than three wires without departing from the present inventive concept. For example, a 2S meter has three wires: line 1, line 2 and neutral as shown in FIG. 1. There is no switching contact on the neutral line, i.e., the load side of the neutral line is always connected to the line side of the service. There are switch contacts S1 and S2 between the line and load side of both line 1 and line 2, respectively. When the switch actuates, the remote disconnect switch attempts to move the contact on both lines to the same position, i.e. both switches S1 and S2 are either open or closed. It is possible for one of the switch contacts to fail to move. This can be the result of, for example, the switch contact becoming fused in one position and, therefore, unable to switch to the other position. When this occurs, there is a hybrid state in the switch. In the resulting state, one line is closed and the other is open. In the case of the 2S meter, the RD switch S1/S2 can be in one of the following states: closed, open, half-open phase "A", and half-open phase "C", where "phase A" corresponds to Line 1 and "phase C" corresponds to line 2.

Tables illustrated in FIGS. 2, 3 and 4 illustrate outcomes of a method of inferring a state of the switch (and internal contacts) from the load, line, and current data for each phase when bypass detection is enabled in a multiphase meter, when bypass detection is disabled in a multiphase meter and in a single-phase meter, respectively. It will be understood that bypass detection is effectively always enabled in a single-phase meter. It is noted that non-Blondel meter forms use one of the line side of phases as the reference for all other voltage comparisons since the neutral line is not accessible. All other meter forms use the neutral line as reference.

$LoadA_{Ref}=Load_{Avoltage}$-Reference Voltage$_{[With\ 180\ degree\ phase\ shift]}$
$LineA_{Ref}=Line_{Avoltage}$-Reference Voltage$_{[With\ 180\ degree\ phase\ shift]}$
$LoadC_{Ref}=Load_{CVoltage}$-Reference Voltage
$LineC_{Ref}=Line_{CVoltage}$-Reference Voltage For the non-Blondel meters, $Line_{CVoltage}$=Reference Voltage. As used herein, current is defined as flowing when its measured value is above about 0.5 A. The bypass detection feature of the meter uses the inferred position of a switch to report bypass conditions. This being the case, the inferred position can change depending on whether bypass detection is enabled or disabled. It will be understood that although embodiments of the present inventive concept discuss using current as the electrical characteristic used in determining position, embodiments of the present inventive concept are not limited thereto. Any electrical characteristic, for example, current, voltage, a combination thereof and the like, may be used without departing from the scope of the present inventive concept.

Inferring a position of a switch based on a position of a switch in close proximity thereto (proximity switch) may not be overly accurate and may require additional features in the device, for example, a meter, that may increase the cost of the meter. Accordingly, some embodiments of the present inventive concept provide a position sensing module configured to determine a position of the integrated disconnect switch (RD switch) of an electric meter based on measured current flow through the meter and measured line-side and load-side voltages of that meter over a period of time as will be discussed further below.

It will be understood that the period of time observed may vary based on the situation and any examples discussed herein do not limit the present inventive concept. Furthermore, as discussed above, some embodiments of the present inventive concept utilize the line-side and load-side voltages of the meter and the current flow through the meter, however, other electrical characteristics of the device may be used without departing from the scope of the present inventive concept. Although embodiments are discussed herein with respect to meters, specifically electric meters, it will be understood that other devices may benefit from the teachings discussed herein.

Embodiments of the present inventive concept provide improved methods of detecting a position of an RD switch. For example, if the RD switch is commanded to open and/or close, but attempts to drive the relay open or closed fail to move the relay to a new position, embodiments of the present inventive concept may detect this, whereas, the conventional proximity solution may fail because the proximity switch may have opened as commanded. The ability to detect a switch that does not respond correctly to commands is useful for correcting anomalous failures of the relay to move to a new position and for reporting relay failures. This is also useful for detecting dual-pole relays that malfunction and get stuck (even temporarily) in a half-open state, wherein contact is made on a single pole, but not the other.

Furthermore, if the RD switch is manipulated manually outside of the normal operation, embodiments of the present inventive concept may detect this situation as well. The ability to sense this situation is useful for detecting accidental movement of the relay in transit or manual tampering. Manual tampering may be an attempt to unlawfully bypass a meter to avoid being charged for consumption.

Thus, embodiments of the present inventive concept may help detect electrical connections which circumvent the electric meter (bypasses/bridges) as discussed in commonly assigned U.S. patent application Ser. No. 16/809,867 (170084-00131), the contents of which was incorporated herein by reference above. Thus, the ability to detect this situation is useful for reporting attempts to consume power without being metered.

Figure 5:
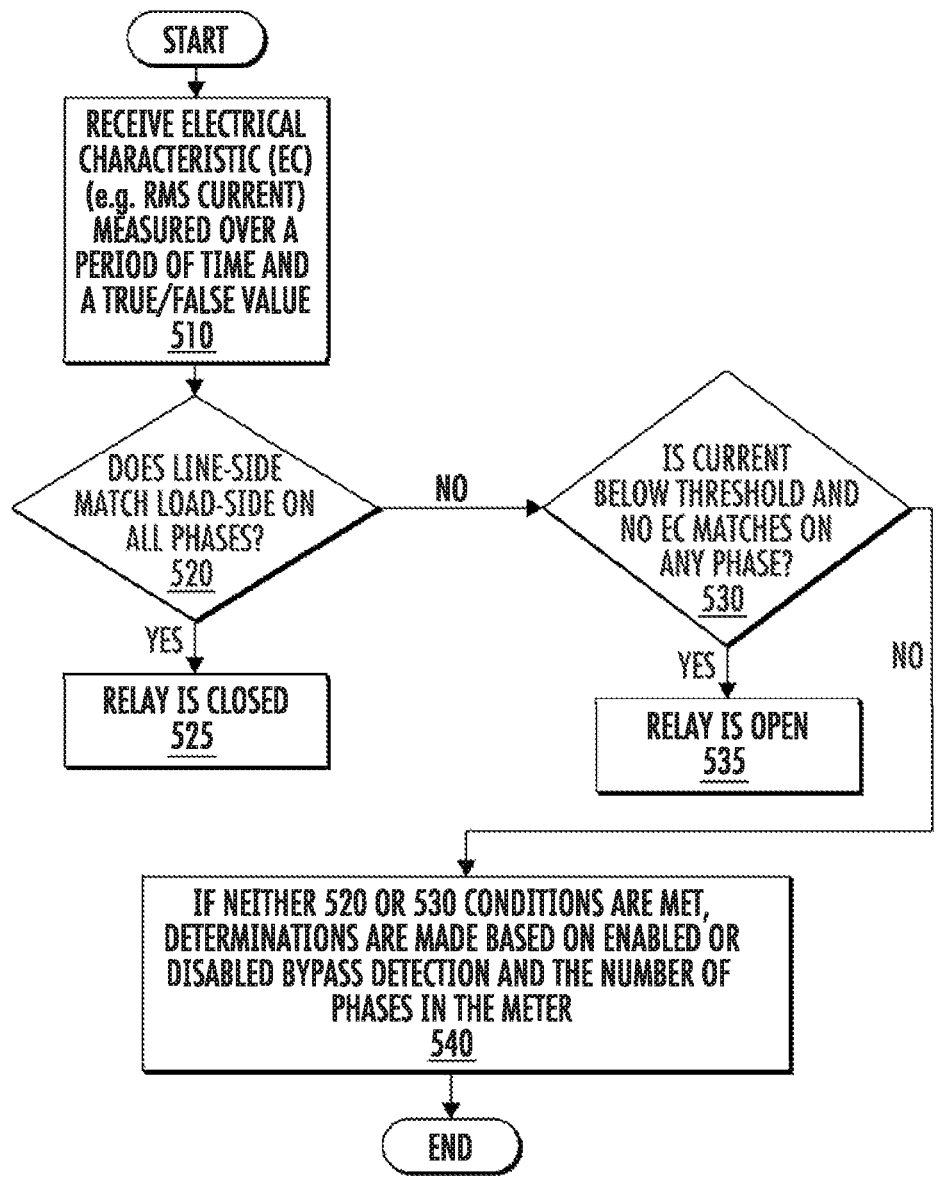
FIG. 5 is flowchart illustrating operations of methods of sensing a position of a switch in accordance with some embodiments of the present inventive concept.

Referring now to the flowchart of FIG. 5, operations for sensing a position of a switch using a position sensing module (block 740 of FIG. 7) in accordance with embodiments of the present inventive concept will be discussed. Operations begin at block 510 by receiving measurements related to an electrical characteristic, for example, root mean square (RMS) currents, measured over a period of time. The period of time may be selected for the particular situation, but in some embodiments may be one second. Thus, for example, every second, the position sensing module receives the RMS current measured over that second on each phase of the meter. The position sensing module also receives a true/false value for each phase of the meter. The true/false value may indicate whether measured electrical characteristics, for example, voltages, on the line-side of the meter for that phase match the measured voltages on the load-side of the meter for that phase (block 110).

In some embodiments, the true/false value (indication) for voltage matches are received from the LSS module (741, FIG. 7), which sums the difference between line-side and load-side samples every line cycle and produces a match/mismatch (True/False) indication based on whether that sum exceeds a hardcoded threshold (predetermined threshold match value). It will be understood that the threshold is customizable and can change based on the environment. It may not be hardcoded in some embodiments. Furthermore, although the true/false value is discussed herein as being calculated as discussed above, other methods of calculating this value may also be used without departing from the scope of the present inventive concept.

It is determined if the line-side voltages match the load-side voltages on all phases of the meter. If line-side voltage matches the load-side voltage on all phases of the meter, then the position sensing module provides an indication that the relay is closed (block 525).

If it is determined that the line-side voltages do not match the load-side voltages on any of the phases, it is determined if the current through each phase is less than a particular threshold (current threshold), for example, 0.5 A (block 530). If the current through each phase of the meter is below the threshold (0.5 A) and there are no voltage matches on any phases of the meter, then the position sensing module declares the relay open (block 535).

If neither condition of blocks 520 or 530 are met (relay is not determined to be open or closed), determinations about the state of the meter may be made based various other parameters (block 540). The state of the meter may be open, closed or a combination of both. For example, if a meter has two phases, bypass detection is disabled on the meter, and the current flow through each phase of the meters is below 0.5 A, the position sensing module may determine that the relay is open if the line-side voltage matches the load-side voltage on one phase but not the other.

If a meter has two phases, bypass detection is enabled on the meter, and the current flow through each phase of the meter is below 0.5 A, the position sensing module may determine that the relay is closed if the line-side voltage matches the load-side voltage on one phase but not the other. This may increase the likelihood that the bypass detection module works as designed.

If a meter has two phases, the only current flow through the meter is in a single phase of the meter and it exceeds the threshold (0.5 A), and the line-side voltage only matches the load-side voltage on the phase that is passing current, then the position sensing module will flag an error. The position sensing module will flag an error if there is current flow in excess of 0.5 A through a phase but there is no match between the line-side and load-side voltages on that phase. FIGS. 2-4 illustrate the details of the outcomes of each of the scenarios discussed above.

FIG. 6 is a diagram illustrating the various inputs to the position detection module and the corresponding inference in accordance with some embodiments of the present inventive concept. It will be understood that FIG. 6 is provided for example only and that embodiments of the present inventive concept are not limited thereto.

Figure 7:
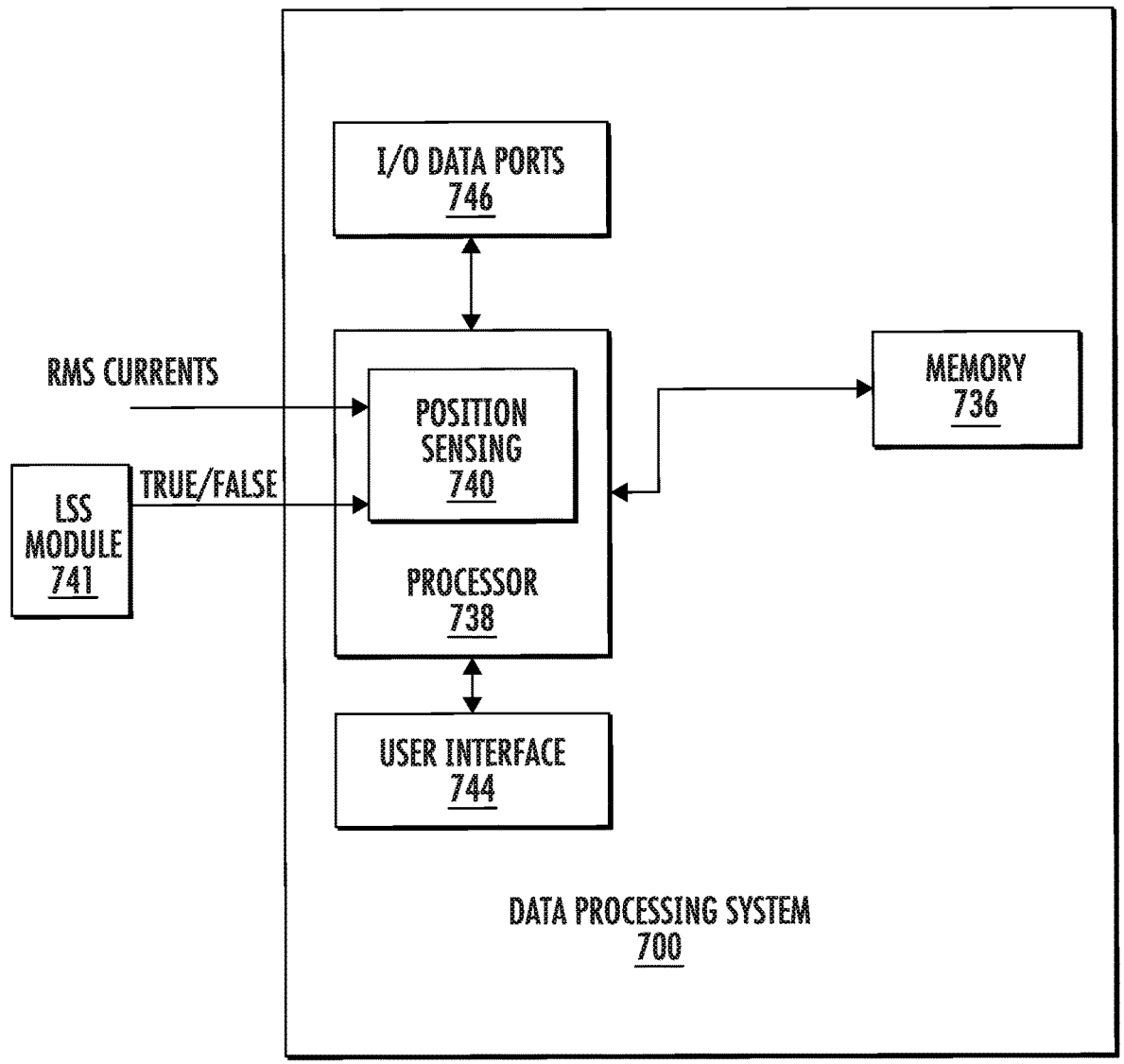
FIG. 7 is a block diagram illustrating a basic data processing system that can be used in accordance with some embodiments of the present inventive concept.

Referring now to FIG. 7, an exemplary embodiment of a data processing system 700 suitable for use in accordance with some embodiments of the present inventive concept will be discussed. For example, the data processing system 700 may be provided at the meter, at the remote location or both without departing from the scope of the present inventive concept. As illustrated in FIG. 7, the data processing system 700 includes a user interface 744 such as a display, a keyboard, keypad, touchpad or the like, I/O data ports 746 and a memory 736 that communicates with a processor 738. The I/O data ports 746 can be used to transfer information between the data processing system 700 and another computer system or a network. These components may be conventional components, such as those used in many conventional data processing systems, which may be configured to operate as described herein. This data processing system 700 may be included any type of computing device without departing from the scope of the present inventive concept.

As further illustrated in FIG. 7, the processor 738 includes a position sensing module 740 configure to perform operations discussed above with respect to embodiments of the inventive concept. The position sensing module received electrical characteristics, for example, currents or voltages, as well as comparison results (True/False) from an LSS module 741 associated with the meter. It will be understood that although the LSS module and data processor 738 are illustrated as separate modules, these modules may be combined without departing from the scope of the present inventive concept.

As briefly discussed above, embodiments of the present inventive concept provide improved methods for sensing a position of a relay in a RD meter. These methods may improve safety as well as provide a cost savings to the utility.

Example embodiments are described above with reference to block diagrams and/or flowchart illustrations of methods, devices, systems and/or computer program products. It is understood that a block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means (functionality) and/or structure for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the functions/acts specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, example embodiments may be implemented in hardware and/or in software (including firmware, resident software, micro-code, etc.). Furthermore, example embodiments may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Computer program code for carrying out operations of data processing systems discussed herein may be written in a high-level programming language, such as Java, AJAX (Asynchronous JavaScript), C, and/or C++, for development convenience. In addition, computer program code for carrying out operations of example embodiments may also be written in other programming languages, such as, but not limited to, interpreted languages. Some modules or routines may be written in assembly language or even micro-code to enhance performance and/or memory usage. However, embodiments are not limited to a particular programming language. It will be further appreciated that the functionality of any or all of the program modules may also be implemented using discrete hardware components, one or more application specific integrated circuits (ASICs), or a field programmable gate array (FPGA), or a programmed digital signal processor, a programmed logic controller (PLC), microcontroller or graphics processing unit.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

In the drawings and specification, there have been disclosed example embodiments of the inventive concept. Although specific terms are employed, they are used in a generic and descriptive sense only and not for purposes of limitation, the scope of the inventive concept being defined by the following claims.

That which is claimed is:

1. A position sensing module associated with a device, the position sensing module configured to:
   receive electrical characteristics associated with one or more phases of the device over a predetermined period of time, the one or more phases each having one or more switches, respectively, the one or more switches being configured to connect service to or disconnect service from a customer, the one or more switches defining, for each phase, a line-side of the device and a load-side of the device, wherein receiving electrical characteristics comprises receiving root mean square (RMS) currents measured over the predetermined period of time for each phase of the device;
   calculate a match indicator for each phase of the device, the match indicator indicating whether an electrical characteristic on the load-side of the device matches a same electrical characteristic on the line-side of the device for each phase of the device; and
   determine a position of the one or more switches based on the received RMS currents for each phase of the device and the calculated match indicator for each phase of the device;
   the match indicator comprising a true value or a false value for each phase of the device, a true value indicating that a measured load-side voltage of the device matches a measured line-side voltage of the device for each phase of the device and a false value indicating that the measured load-side voltage of the device does not match the measured line-side voltage of the device for each phase of the device;
   sum a difference between the line-side voltage and the load-side voltage for each phase;
   provide the true value if the sum is less than a predetermined threshold match value; and
   provide the false value if the sum exceeds the predetermined threshold match value.

2. A meter for measuring an amount of service provided to a customer, the meter comprising a position sensing module configured to:
   receive electrical characteristics associated with one or more phases of the meter over a predetermined period of time, the one or more phases each having one or more switches, respectively, the one or more switches being configured to connect service to or disconnect service from the customer, the one or more switches defining, for each phase, a line-side of the meter and a load-side of the meter, wherein the electrical characteristics comprises root mean square (RMS) currents measured over the predetermined period of time for each phase of the meter;
   calculate a match indicator for each phase of the meter, the match indicator indicating whether an electrical characteristic on the load-side of the meter matches a same electrical characteristic on the line-side of the meter for each phase of the meter; and
   determine a position of the one or more switches based on the received RMS currents for each phase of the meter and the calculated match indicator for each phase of the meter;
   the match indicator comprising a true value or a false value for each phase of the meter, a true value indicating that a measured load-side voltage of the meter matches a measured line-side voltage of the meter for each phase of the meter and a false value indicating that the measured load-side voltage of the meter does not match the measured line-side voltage of the meter for each phase of the meter;
   sum a difference between the line-side voltage and the load-side voltage for each phase;
   provide the true value if the sum is less than a predetermined threshold match value; and
   provide the false value if the sum exceeds the predetermined threshold match value.

3. A method for sensing a position of a relay in a device, the method comprising:
   receiving electrical characteristics associated with one or more phases of the device over a predetermined period of time, the one or more phases each having one or more switches, respectively, the one or more switches being configured to connect service to or disconnect service from a customer, the one or more switches defining, for each phase, a line-side of the device and a load-side of the device, wherein receiving electrical characteristics comprises receiving root mean square (RMS) currents measured over the predetermined period of time for each phase of the device;
   calculating a match indicator for each phase of the device, the match indicator indicating whether an electrical characteristic on the load-side of the device matches a same electrical characteristic on the line-side of the device for each phase of the device; and
   determining a position of the one or more switches based on the received RMS currents for each phase of the device and the calculated match indicator for each phase of the device;
   calculating the match indicator comprising calculating a true value or a false value for each phase of the device, a true value indicating that a measured load-side voltage of the device matches a measured line-side voltage of the device for each phase of the device and a false value indicating that the measured load-side voltage of the device does not match the measured line-side voltage of the device for each phase of the device;

summing a difference between the line-side voltage and the load-side voltage for each phase;

providing the true value if the sum is less than a predetermined threshold match value; and providing the false value if the sum exceeds the predetermined threshold match value.

\* \* \* \* \*